US 6,541,359 B1

(12) United States Patent
Gabriel et al.

(10) Patent No.: US 6,541,359 B1
(45) Date of Patent: Apr. 1, 2003

(54) OPTIMIZED GATE IMPLANTS FOR REDUCING DOPANT EFFECTS DURING GATE ETCHING

(75) Inventors: Calvin Todd Gabriel, Cupertino, CA (US); Tammy D. Zheng, Fremont, CA (US); Emmanuel de Muizon, Fremont, CA (US); Linda A. Leard, San Jose, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/495,415

(22) Filed: Jan. 31, 2000

(51) Int. Cl.7 .......................................... H01L 21/3205
(52) U.S. Cl. ...................... 438/585; 438/521; 438/524; 438/588
(58) Field of Search ................................. 438/585, 243, 438/386, 342, 595, 521, 524, 888

(56) References Cited

U.S. PATENT DOCUMENTS

| | | | |
|---|---|---|---|
| 4,978,626 A | 12/1990 | Poon et al. | 437/44 |
| 6,197,648 B1 * | 3/2001 | Kasai et al. | 438/305 |
| 6,312,997 B1 * | 11/2001 | Tran | 438/303 |

OTHER PUBLICATIONS

Patent Abstracts of Japan, vol. 1999, No. 03, Mar. 31, 1999 –& JP 10 335480 A (NEC Corp), Dec. 18, 1998 abstract –& US 6 033 944 A (Shida Akira) Mar. 7, 2000 abstract; claims; figures 4A–4D column 9, line 16—line 60, column 10, line 36—line 38.

Patent Abstracts of Japan, vol. 1998, No. 05, Apr. 30, 1998 & JP 10 012748 A (Sony Corp), Jan. 16, 1998 abstract; figures.

* cited by examiner

Primary Examiner—David Nelms
Assistant Examiner—Reneé R Berry
(74) Attorney, Agent, or Firm—Peter Zawilski

(57) ABSTRACT

A method and apparatus thereof for fabricating an integrated circuit on a laminate having a gate electrode layer over a silicon dioxide layer. Detection of the gate etch endpoint signal is improved by maximizing the use of a faster etching dopant material (e.g., n-type dopant) and minimizing the use of a slower etching dopant material (e.g., p-type dopant) in the gate electrode layer. In one embodiment, a first portion of the gate electrode layer, substantially corresponding only to the location at which a gate is to be formed, is doped with the slower etching dopant material. The remaining portion of the gate electrode layer is doped with the faster etching dopant material; thus, more of the gate electrode layer is doped with the faster etching dopant material than with the slower etching dopant material. A gate mask is aligned over the gate electrode layer, and the unmasked portions of the gate electrode layer are removed using an etchant. The n-doped portions of gate electrode layer will etch away faster, and because the gate electrode layer is predominantly n-type, a strong and detectable endpoint signal will be induced when the etchant reaches the silicon dioxide layer.

20 Claims, 12 Drawing Sheets

OPTIMIZED GATE IMPLANTS FOR REDUCING DOPANT EFFECTS DURING GATE ETCHING

TECHNICAL FIELD

The present invention relates to the gate etching process used during integrated circuit fabrication. More specifically, the present invention pertains to a method to make the gate etching endpoint signal stronger and more consistent.

BACKGROUND ART

Integrated circuits are fabricated en masse on silicon wafers using well-known techniques such as photolithography. Using these techniques, a pattern ("mask") that defines the size and shape of the components and gates within a given layer of the die is applied to the wafer. The pattern applied to the wafer is laid out in an array, or matrix, of reticle images. A wafer stepper holds the pattern over a wafer and projects the pattern image of the reticle onto the wafer.

Prior Art FIG. 1A shows a laminate 10 used in the fabrication of integrated circuits in accordance with one typical prior art embodiment. Laminate 10 includes a substrate 15 (e.g., a silicon-based semiconductor), a gate dielectric layer 16 (e.g., silicon dioxide or some other dielectric material), and a gate electrode layer 17 (e.g., n-doped polysilicon).

With reference next to Prior Art FIG. 1B, in order to form gate 20, portions of gate electrode layer 17 are removed, typically using a gate etch process. As described above, a photolithography process is used in a known manner to apply a gate mask 22 at the location at which gate 20 will be formed. When an etchant (e.g., a plasma etch) is then applied, the portions of gate electrode layer 17 around gate 20 are removed, while the material under gate mask 22 remains to form the gate (see Prior Art FIG. 1C).

Traditionally, integrated circuits were made with n-type polysilicon gates. The polysilicon was doped n-type during polysilicon deposition by adding $PH_3$ or after polysilicon deposition using $POCl_3$. Thus, the gate etch process had to remove only n-type polysilicon in order to form the gates.

For deep submicron CMOS (complementary metal-oxide semiconductor) circuits, dual-implanted polysilicon or amorphous silicon is preferred (for simplicity in the discussion, both will be referred to as "polysilicon" or "poly"). After depositing undoped poly, implant masks are used to create n-type poly over n-channel transistors and p-type poly over p-channel transistors. Depending on the implant mask arrangement, some portions of the poly may not be doped at all ("undoped" or "unimplanted"), and other portions may be doped with both types of dopant material (n/p-doped). Such dual-implanted polysilicon allows for better control of the p-channel transistor properties.

However, the dual-implanted poly can create a problem during the gate etch process, because some combination of undoped, n-doped, p-doped, and n/p-doped poly will be exposed to the etchant. Each of these differently doped polysilicons will etch at a different rate. In general, p-doping will depress the etch rate, while n-doping will enhance it. The difference in etch rates can be significant; for example, when $HBr/O_2$ etchant is used, the difference in the etching rate between p-doped poly and n-doped poly can be as much as 37 percent. Such large differences in etch rates increase the likelihood of microtrenching of the gate oxide layer; that is, a local breakthrough of the gate oxide layer followed by etching into the silicon layer adjacent to the gate oxide layer. Microtrenching is not desirable because it introduces a variable into the fabrication process and may also affect the electrical properties of the integrated circuit.

Prior Art FIG. 2A shows a laminate 30 used in the fabrication of integrated circuits (e.g., a CMOS) in accordance with one typical prior art embodiment. Laminate 30 includes a substrate 35, typically a silicon-based semiconductor layer; a gate dielectric layer 36, typically silicon dioxide or some other dielectric material; and gate electrode layer 37, typically doped polysilicon. Here, a p-gate 41 and an n-gate 42 are to be formed in the particular locations shown. Accordingly, gate electrode layer 37 includes a p-doped region 43 encompassing the location of p-gate 41 and an n-doped region 44 encompassing the location of n-gate 42.

In the prior art, the p-dopant material and the n-dopant material are implanted in a known manner using implant masks. These implant masks are used to broadly implant the correct dopant material in the proper locations (e.g., p-doped region 43 and n-doped region 44). P-gate 41 and n-gate 42 are then formed by removing the excess portions of gate electrode layer 37 using a gate etch process. Since the excess portions are removed to form the gate, in general it is important only that the doped regions bound the locations where the gates will be formed.

With reference now to Prior Art FIG. 2B, p-doped region 43 will etch away at a slower rate than n-doped region 44. As a result, when n-doped region 44 has been removed by etching, forming n-gate 42, portions of the p-doped region (p-doped regions 43a and 43b) will still remain. Should the gate etch process continue in order to remove p-doped regions 43a and 43b, the etchant can form microtrenches (e.g., microtrench 50) in gate dielectric layer 35.

To avoid microtrenching while retaining the benefits of dual-implanted poly in CMOS design, it is important to signal endpoint when n-doped region 44 is cleared. At endpoint, the gate etch process is halted, and a different etchant is introduced. The new etchant exhibits greater selectivity between p-doped regions 43a and 43b and gate dielectric layer 35; that is, the new etchant will work to clear p-doped regions 43a and 43b without operating on gate dielectric layer 35, so that microtrenches will not be formed.

However, a problem in the prior art is that the endpoint signal may be too weak to detect; therefore, it does not trigger endpoint and the switch to the different etchant. In those cases, the gate etch process continues for too long using the nonselective etchant, and microtrenching is thus likely to occur.

Accordingly, what is needed is a method and/or apparatus that can improve the endpoint signal, so that endpoint is consistently triggered at the correct moment and microtrenching is prevented. What is also needed is a method and/or apparatus that can address the above need and that can be used with laminates using various combinations of undoped, n-doped, p-doped, and n/p-doped polysilicon with significantly different etch rates. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides a method and apparatus thereof that can improve the endpoint signal, so that endpoint is consistently triggered at the correct moment and microtrenching is prevented. The present invention can also be used with laminates using various combinations of undoped, n-doped, p-doped, and n/p-doped polysilicon with significantly different etch rates.

In accordance with the present embodiment of the present invention, detection of the gate etch endpoint signal is improved by maximizing the use of a faster etching dopant material and minimizing the use of a slower etching dopant material in the gate electrode layer. The faster etching dopant material will etch away faster, and because the gate electrode layer is predominantly made up of the faster etching dopant material, a strong and detectable endpoint signal will be induced when the etchant reaches the silicon dioxide layer.

In one embodiment, a first portion of the gate electrode layer, substantially corresponding only to the location at which a gate is to be formed, is doped with the slower etching dopant material. A second portion of the gate electrode layer, larger than the first portion, is doped with the faster etching dopant material. Alternatively, the remaining portion of the gate electrode layer (that portion not doped with the slower etching dopant material) is doped with the faster etching dopant material. In either case, more of the gate electrode layer is doped with the faster etching dopant material than with the slower etching dopant material. A gate mask is aligned over the gate electrode layer, and the unmasked portions of the gate electrode layer are removed using an etchant. Because the gate electrode layer is predominantly made up of the faster etching dopant material, a strong and detectable endpoint signal will be induced when the etchant reaches the silicon dioxide layer, as described above.

In another embodiment of the present invention, an implant mask is aligned over the gate electrode layer within an alignment tolerance. The implant mask allows a first dopant material to be implanted into the gate electrode layer at a location where a gate is to be formed. In one embodiment, the implant mask is sized so that the first dopant material does not extend beyond the edges of the gate including the alignment tolerance. In another embodiment, the implant mask is sized so that the first dopant material does not extend beyond the edges of the gate (with no allowance for alignment tolerance). In still another embodiment, the implant mask is sized so that the first dopant material does not extend to the edges of the gate. Similarly, a second implant mask is used to implant a second dopant material into the gate electrode layer at a location where a second gate is to be formed. In its various embodiments, the second implant mask is also sized so that the second dopant material does not extend beyond the edges of the second gate including the alignment tolerance, does not extend beyond the edges of the second gate (with no allowance for alignment tolerance), or does not extend to the edges of the gate. In these embodiments, a gate mask is aligned over the dopant material(s), and the unimplanted gate electrode layer not under the gate mask is removed using an etchant. Because the gate etch will see only the unimplanted portions of the gate electrode layer, all portions will signal the endpoint at about the same time, and so a strong and consistent endpoint signal can be detected.

Alternatively, the second dopant material can be implanted into the portion of the gate electrode layer not implanted with the first dopant material. As described above, in this embodiment the gate electrode layer is predominantly made up of the faster etching dopant material, and so a strong and detectable endpoint signal will be induced when the etchant reaches the silicon dioxide layer.

In the present embodiment, the integrated circuit is a deep submicron complementary metal-oxide semiconductor (CMOS). In one embodiment, the laminate used to fabricate the integrated circuit and gates in accordance with the present invention is comprised of a silicon dioxide gate dielectric layer above a silicon-based semiconductor substrate. In one embodiment, the gate electrode layer is comprised of polysilicon, and in another embodiment the gate electrode layer is comprised of amorphous silicon.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

PRIOR ART

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1A:
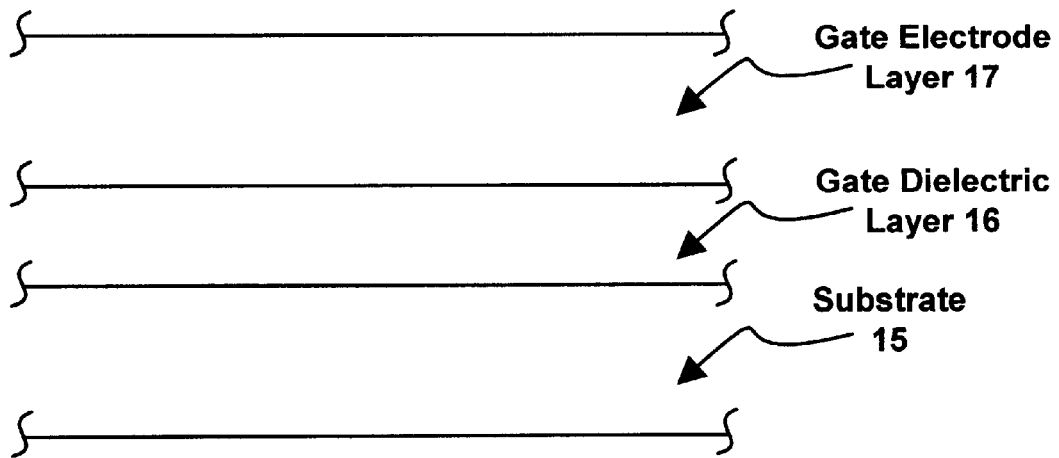
FIG. 1A illustrates a laminate used in the fabrication of integrated circuits in accordance with a prior art embodiment.
Figure 1B:
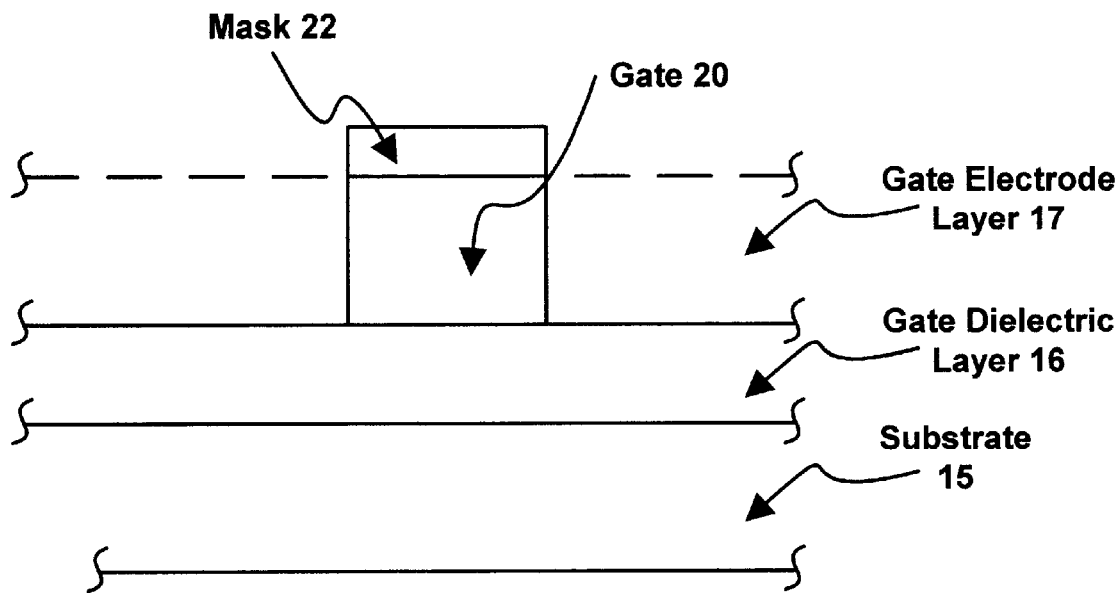
FIGS. 1B and 1C illustrate the formation of a gate using the laminate of Prior Art FIG. 1A in accordance with a prior art embodiment.
Figure 1C:
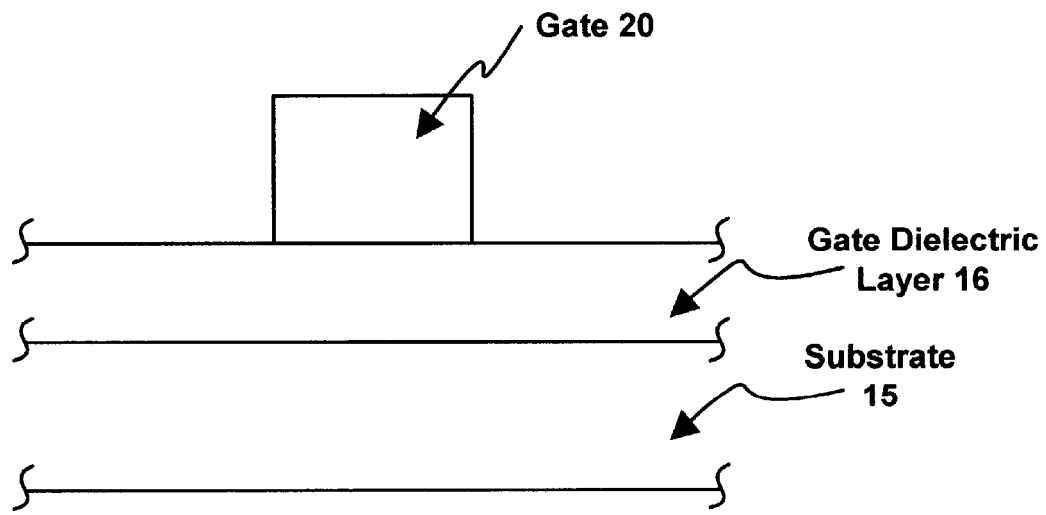
Figure 2A:
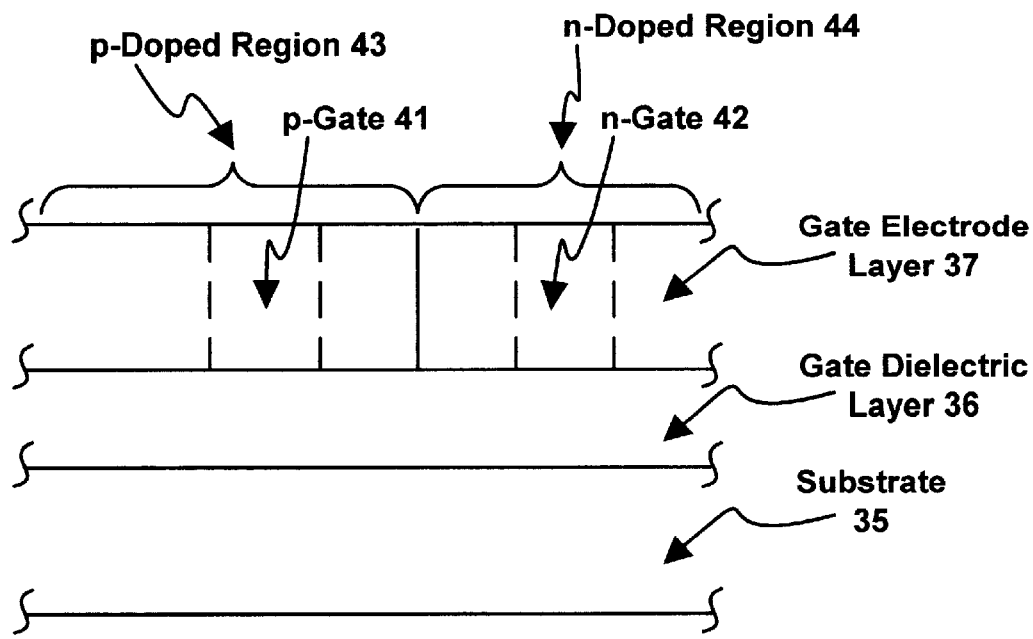
FIG. 2A illustrates a laminate with a dual-implanted gate electrode layer in accordance with a prior art embodiment.
Figure 2B:
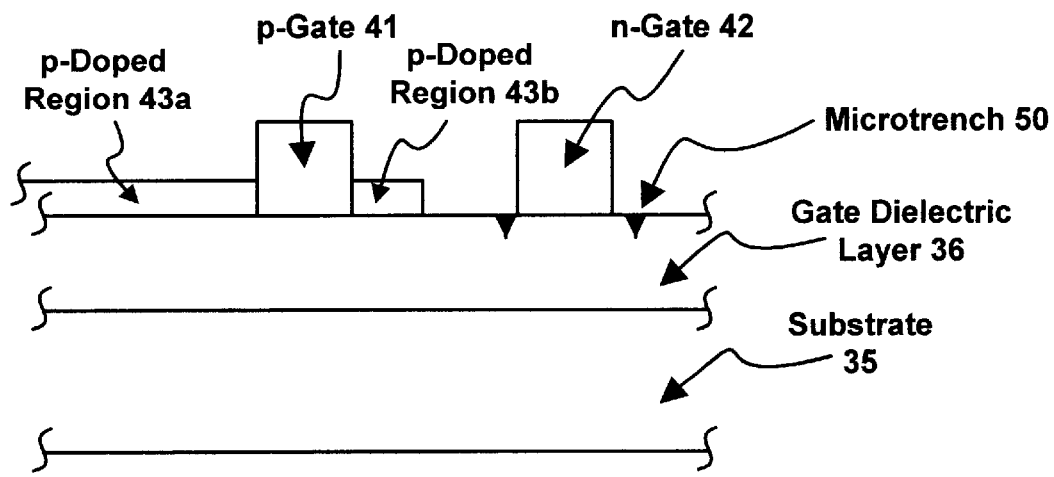
FIG. 2B illustrates the formation of microtrenches in the laminate of Prior Art FIG. 2A during a gate etch process in accordance with a prior art embodiment.
Figure 3:
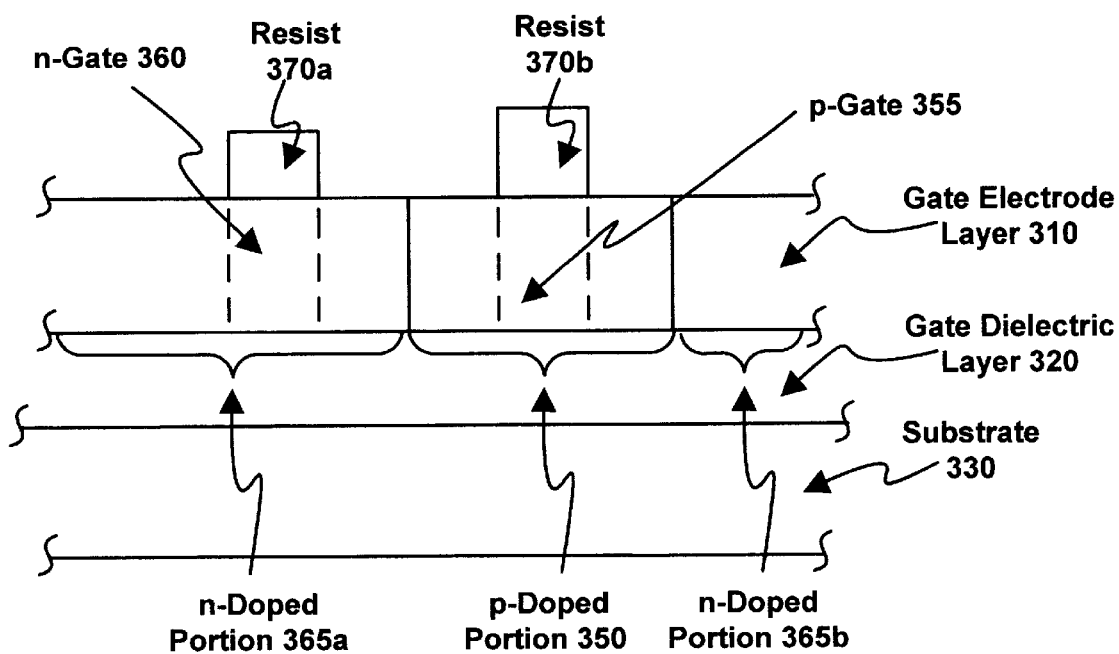
FIG. 3 is a cross-section of one embodiment of a laminate with a dual-implanted gate electrode layer in accordance the present invention.

FIG. 3 is a cross-section of a laminate 300 with a dual-implanted gate electrode layer 310 used to fabricate an integrated circuit in accordance with one embodiment of the present invention. In one embodiment, gate electrode layer 310 is comprised of polysilicon, and in another embodiment gate electrode layer 310 is comprised of amorphous silicon; however, it is appreciated that gate electrode layer 310 may comprise other materials in accordance with the present invention. For simplicity of discussion, the present invention is discussed in the context of a polysilicon gate electrode layer.

Laminate 300 is used to fabricate an integrated circuit such as a complementary metal-oxide semiconductor (CMOS), in particular a deep submicron CMOS. In the present embodiment, laminate 300 is comprised of gate dielectric layer 320 above substrate 330. In one embodiment, gate dielectric layer 320 comprises silicon dioxide, although it is appreciated that in other embodiments, different dielectric materials may be used.

In one embodiment, substrate 330 is a silicon-based semiconductor. It is appreciated that substrate 330 may also include source and drain regions, lightly-doped regions, shallow trench isolation or field oxide regions, and the like (not shown). It is further appreciated that substrate 330 may be other than silicon-based.

Continuing with reference to FIG. 3, in the present embodiment, n-gate 360 and p-gate 355 are to be formed in gate electrode layer 310. Accordingly, n-dopant is implanted into n-doped portions 365a and 365b, and p-dopant is implanted into p-doped portion 350. In accordance with the present invention, the faster etching dopant material is maximized and the slower etching dopant material is minimized. Thus, in the present embodiment, the use of n-dopant is maximized because it enhances the etch rate of a given etchant, and the use of p-dopant is minimized because it depresses the etch rate for the same etchant. Accordingly, n-doped portions 365a and 365b (in total) are larger than p-doped portion 350.

Therefore, in accordance with the present invention, because gate electrode layer 310 is predominantly made up of the faster etching dopant material (e.g., n-dopant), a strong and detectable endpoint signal will be induced when the etchant reaches gate dielectric layer 320 (e.g., the silicon dioxide layer). In other words, n-doped portions 365a and 365b will be etched away at a uniform rate, and therefore will reach the silicon dioxide layer at about the same time. In addition, a large surface area of gate dielectric layer 320 will be exposed at that time, generating a strong endpoint signal that can be readily detected. The switch can then be made to a more selective etchant that will work on the remainder of p-doped portion 350 but will not attack gate dielectric layer 320, and thus microtrenching of that layer is prevented in accordance with the present invention.

In the present embodiment, the use of n-dopant is maximized by setting the default implant type to be n-dopant. That is, a p-dopant implant is only done where p-type silicon is needed for operation of the integrated circuit (e.g., where a p-gate is needed). In one embodiment, this is implemented by changing the n-dopant and p-dopant implant mask polarities and derivation equations. In this embodiment, a dark field is used for a p-dopant mask (e.g., a mask that will implant only in the designated p-dopant portions), and a clear field is used for the n-dopant mask (e.g., a blocking mask that will implant n-dopant in all portions of gate electrode layer 310 except in the p-doped portions).

Figure 4:
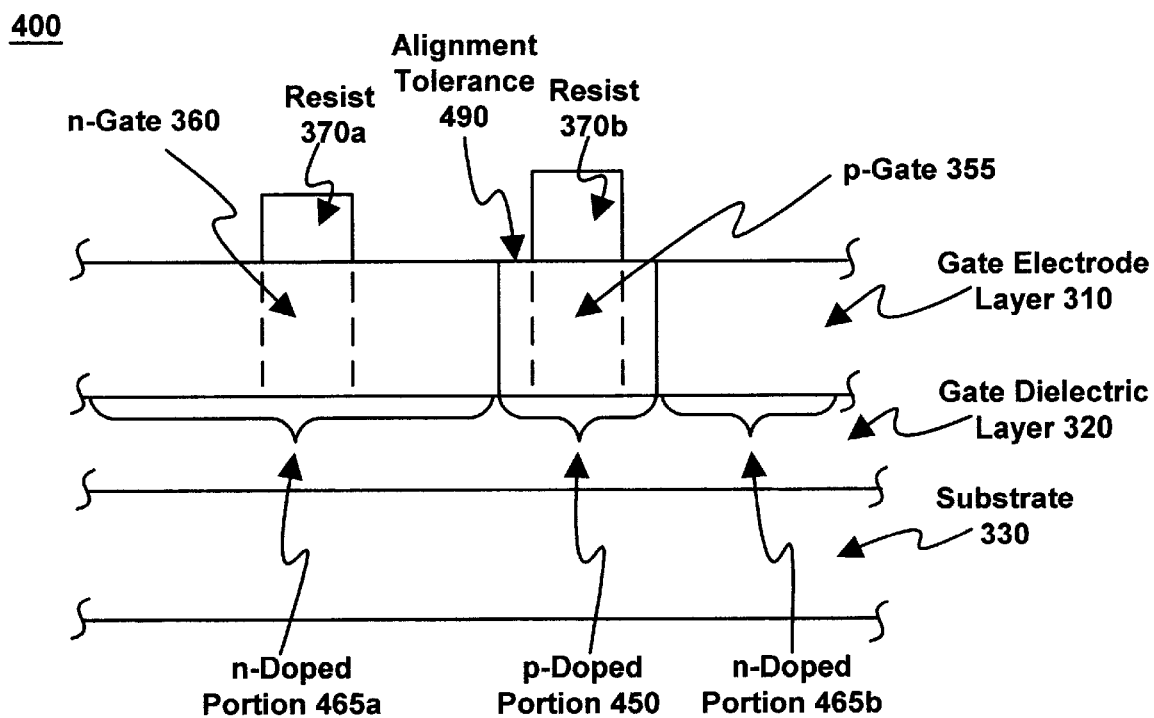
FIG. 4 is a cross-section of another embodiment of a laminate with a dual-implanted gate electrode layer in accordance with the present invention.

FIG. 4 is a cross-section of a laminate 400 with a dual-implanted gate electrode layer that is used to fabricate an integrated circuit in accordance with another embodiment of the present invention. In this embodiment, the p-dopant implant mask is sized so that p-dopant is implanted in a location that more precisely corresponds to the location at which p-gate 355 is to be located. That is, in this embodiment, p-doped portion 450 extends only to the edges of p-gate 355 plus alignment tolerance 490. Alignment tolerance 490 is the tolerance associated with the alignment of the implant mask used for the implantation of the p-dopant. Thus, in this embodiment, the use of p-dopant is minimized to only the amount needed for p-gate 355, with some allowance for misalignment of the p-dopant implant mask.

In one embodiment, n-dopant is implanted into all portions of gate electrode layer 310 except in the p-doped portions; specifically, n-dopant is implanted into n-doped portions 465a and 465b. Thus, in this embodiment, the use of n-dopant is further maximized and the use of p-dopant is further minimized (relative to the embodiment of FIG. 3). As a result, as explained more fully above, a strong and detectable endpoint signal will be induced when the etchant reaches gate dielectric layer 320 (e.g., the silicon dioxide layer), and consequently microtrenching of that layer is prevented.

In another embodiment, if n-gate 360 is not needed, then instead of doping n-doped portions 465a and 465b, these portions of gate electrode layer 310 can be left undoped. Because the undoped portions will etch away faster than p-doped portion 450, a strong and detectable endpoint signal will still be induced when the etchant reaches gate dielectric layer 320 (e.g., the silicon dioxide layer) in a manner similar to that described above.

Figure 5A:
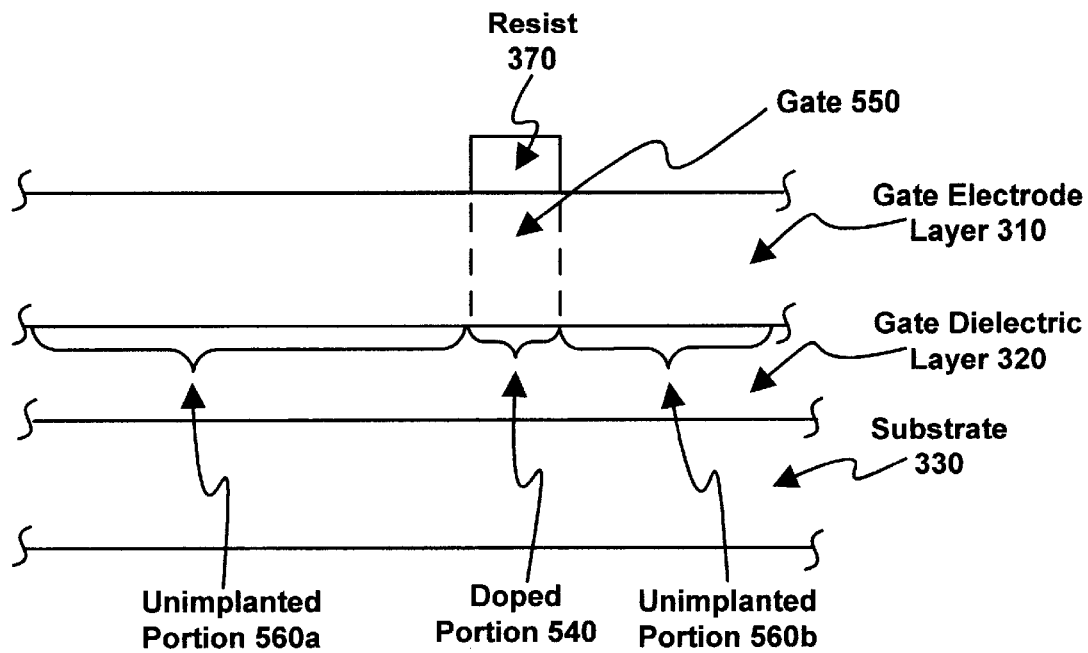
FIG. 5A is a cross-section of one embodiment of a laminate with implant and gate masks aligned in accordance with the present invention.

FIG. 5A is a cross-section of a laminate 500 used to fabricate integrated circuits in accordance with another embodiment of the present invention. In this embodiment, the dopant implant mask is sized such that doped portion 540 does not extend beyond the edges of gate 550 (with no allowance being made for misalignment of the implant mask). The portions of gate electrode layer 310 outside of doped portion 540 (e.g., unimplanted portions 560a and 560b) are not doped. In this embodiment, doped portion 540 can be either n-doped or p-doped and gate 550 can be, respectively, either an n-gate or a p-gate.

In the present embodiment, the gate mask (e.g., resist 370) is aligned such that doped portion 540 exists only under resist 370. Thus, the gate etch will see only the unimplanted polysilicon in unimplanted portions 560a and 560b. As a result, all portions will signal the endpoint at about the same time, and so a strong and consistent endpoint signal will be induced and detected. Consequently, the gate etch process can be halted and so microtrenching is prevented. In this embodiment, it may not be necessary to switch to a more selective etchant after endpoint is signaled.

Although only one gate is shown in FIG. 5A, it is appreciated that more than one gate can be formed in accordance with this embodiment. It will be apparent to one of ordinary skill in the art that, in the case of more than one gate, both n-gates and p-gates can be formed in accordance with this embodiment by first applying an appropriately sized implant mask for one dopant material (e.g., the p-dopant), implanting that dopant, and then applying the appropriately sized implant mask for the other dopant material (e.g., the n-dopant) and implanting that dopant. The portions of gate electrode layer 310 outside of the dope portions are not doped. Thus, the gate etch will see only unimplanted polysilicon, all portions will signal endpoint at about the same time, and a strong and consistent endpoint signal will be induced and detected.

Figure 5B:
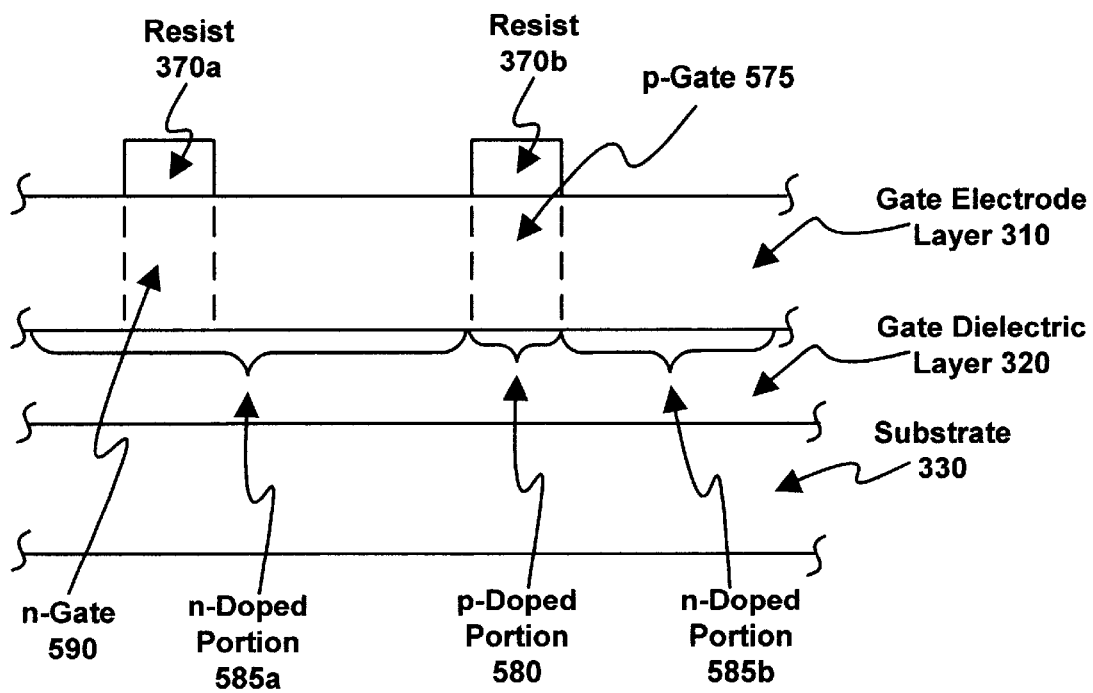
FIG. 5B is a cross-section of another embodiment with implant and gate masks aligned in accordance with the present invention.

With reference to FIG. 5B, another embodiment of a cross-section of a laminate 570 used to fabricate integrated circuits in accordance with the present invention is shown. Similar to the embodiment of FIG. 5A, the dopant implant mask is sized such that p-doped portion 580 does not extend beyond the edge of p-gate 575 (with no allowance for misalignment of the implant mask). In this embodiment, the portions of gate electrode layer outside of p-doped portion 580 are implanted with n-dopant (n-doped portions 585a and 585b) and an n-gate 590 can be formed by etching using a gate mask (e.g., resist 370a). In this embodiment, it is necessary for the p-dopant implant mask, and subsequently the gate mask (e.g., resist 370b), to be precisely aligned with the location of p-gate 575.

In this embodiment, the gate mask for p-gate 575 (e.g., resist 370b) is aligned such that p-doped portion 580 exists only under resist 370b. Thus, the gate etch will see only n-doped polysilicon in n-doped portions 585a and 585b. As a result, all portions will signal the endpoint at about the same time, and so a strong and consistent endpoint signal can be detected. Consequently, the gate etch process can be halted and so microtrenching is prevented.

It is appreciated that, in an alternate embodiment, n-dopant can be used where p-dopant is shown in FIG. 5B, and p-dopant can be used where n-dopant is shown. Gate etching will still occur uniformly so that all portions exposed to the etchant will signal endpoint at about the same time.

Figure 6A:
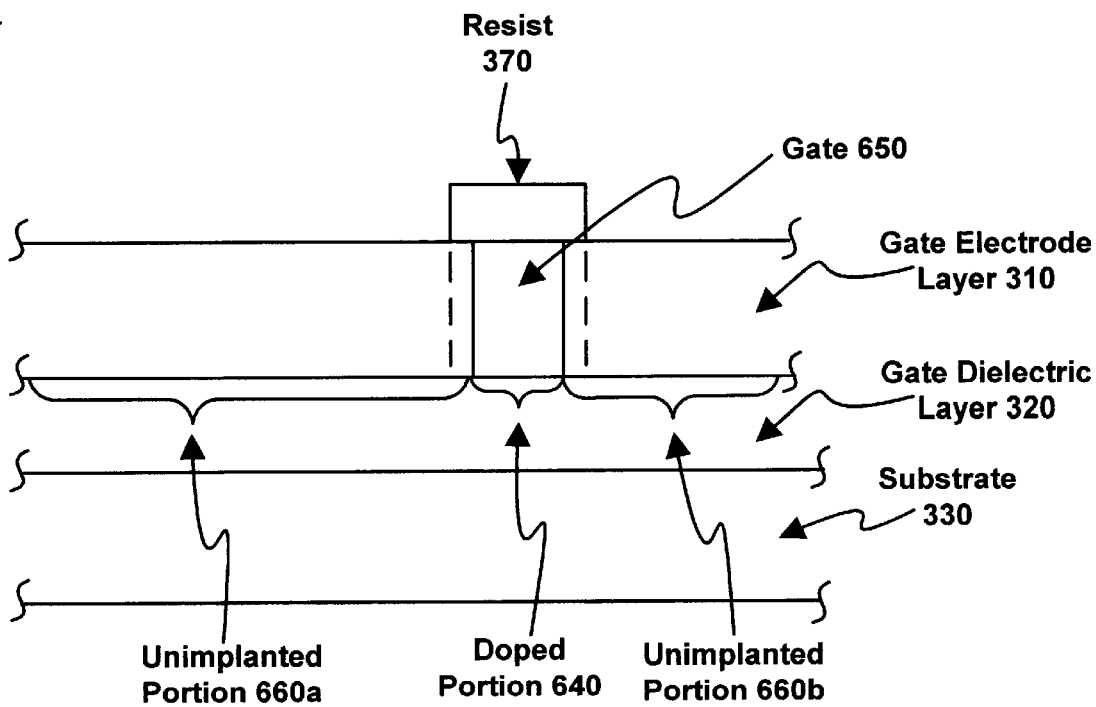
FIG. 6A is a cross-section of one embodiment of a laminate with an implant mask smaller than a gate mask in accordance with the present invention.

FIG. 6A is a cross-section of a laminate 600 used to fabricate integrated circuits in accordance with another embodiment of the present invention. In this embodiment, the dopant implant mask is sized such that doped portion 640 does not extend to the edges of gate 650; thus, a small amount of unimplanted polysilicon will be present under the gate mask (e.g., resist 370). The portions of gate electrode layer 310 outside of doped portion 640 (e.g., unimplanted portions 660a and 660b) are not doped. In this embodiment, doped portion 640 can be either n-doped or p-doped and gate 650 can be, respectively, either an n-gate or a p-gate.

In the present embodiment, the gate mask (e.g., resist 370) is aligned such that doped portion 640 exists only under resist 370. Thus, the gate etch will see only the unimplanted polysilicon in unimplanted portions 660a and 660b. As a result, all portions will signal the endpoint at about the same time, and so a strong and consistent endpoint signal will be induced and detected. Consequently, the gate etch process can be halted and so microtrenching is prevented. In this embodiment, may not be necessary to switch to a more selective etchant after endpoint is signaled.

Although only one gate is shown in FIG. 6A, it is appreciated that more than one gate can be formed in accordance with this embodiment. It will be apparent to one of ordinary skill in the art that, in the case of more than one gate, both n-gates and p-gates can be formed in accordance with this embodiment by first applying an appropriately sized implant mask for one dopant material (e.g., the p-dopant), implanting that dopant, and then applying the appropriately sized implant mask for the other dopant material (e.g., the n-dopant) and implanting that dopant. The portions of gate electrode layer 310 outside of the dope portions are not doped. Thus, the gate etch will see only unimplanted polysilicon, all portions will signal endpoint at about the same time, and a strong and consistent endpoint signal will be induced and detected.

Figure 6B:
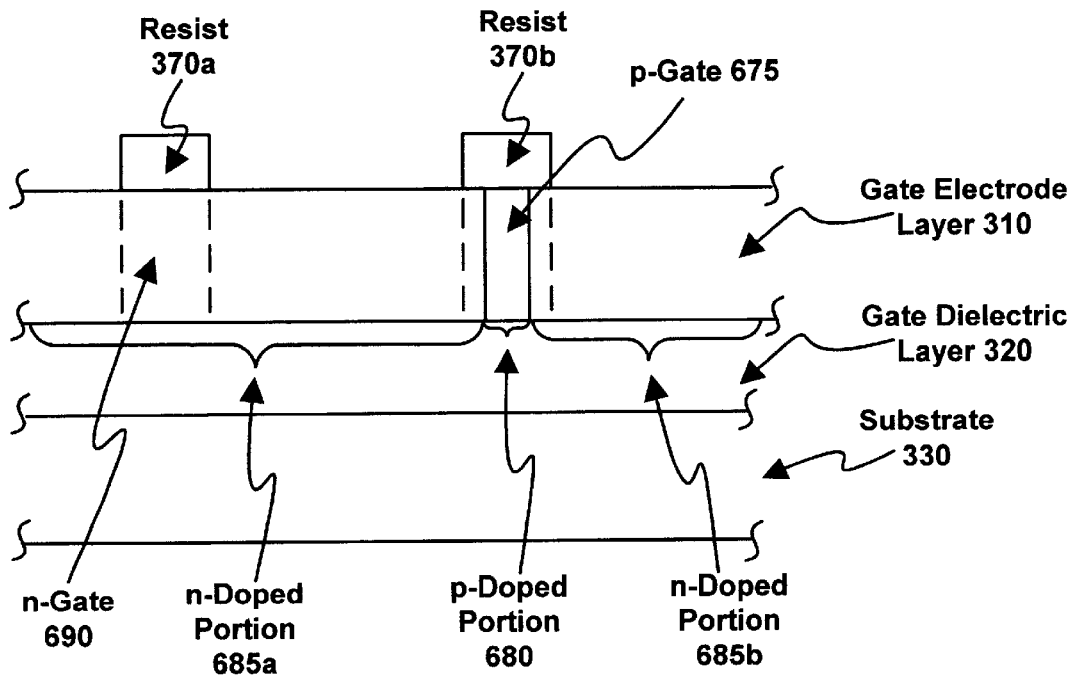
FIG. 6B is a cross-section of another embodiment of a laminate with an implant mask smaller than a gate mask in accordance with the present invention.

With reference to FIG. 6B, another embodiment of a cross-section of a laminate 670 used to fabricate integrated circuits in accordance with the present invention is shown. As in the embodiment of FIG. 6A, the dopant implant mask is sized such that p-doped portion 680 does not extend to the edge of p-gate 675. In this embodiment, the portions of gate electrode layer outside of p-doped portion 680 are implanted with n-dopant (n-doped portions 685a and 685b) and an n-gate 690 can be formed by etching using a gate mask (e.g., resist 370a). In this embodiment, it is necessary for the p-dopant implant mask, and subsequently the gate mask (e.g., resist 370b), to be precisely aligned with the location of p-gate 675.

In this embodiment, the gate mask for p-gate 675 (e.g., resist 370b) is aligned such that p-doped portion 680 exists only under resist 370b. Thus, the gate etch will see only n-doped polysilicon in n-doped portions 685a and 685b. As a result, all portions will signal the endpoint at about the same time, and so a strong and consistent endpoint signal can be detected. Consequently, the gate etch process can be halted and so microtrenching is prevented.

It is appreciated that, in an alternate embodiment, n-dopant can be used where p-dopant is shown in FIG. 6B, and p-dopant can be used where n-dopant is shown. Gate etching will still occur uniformly so that all portions exposed to the etchant signal endpoint at about the same time.

Figure 7:
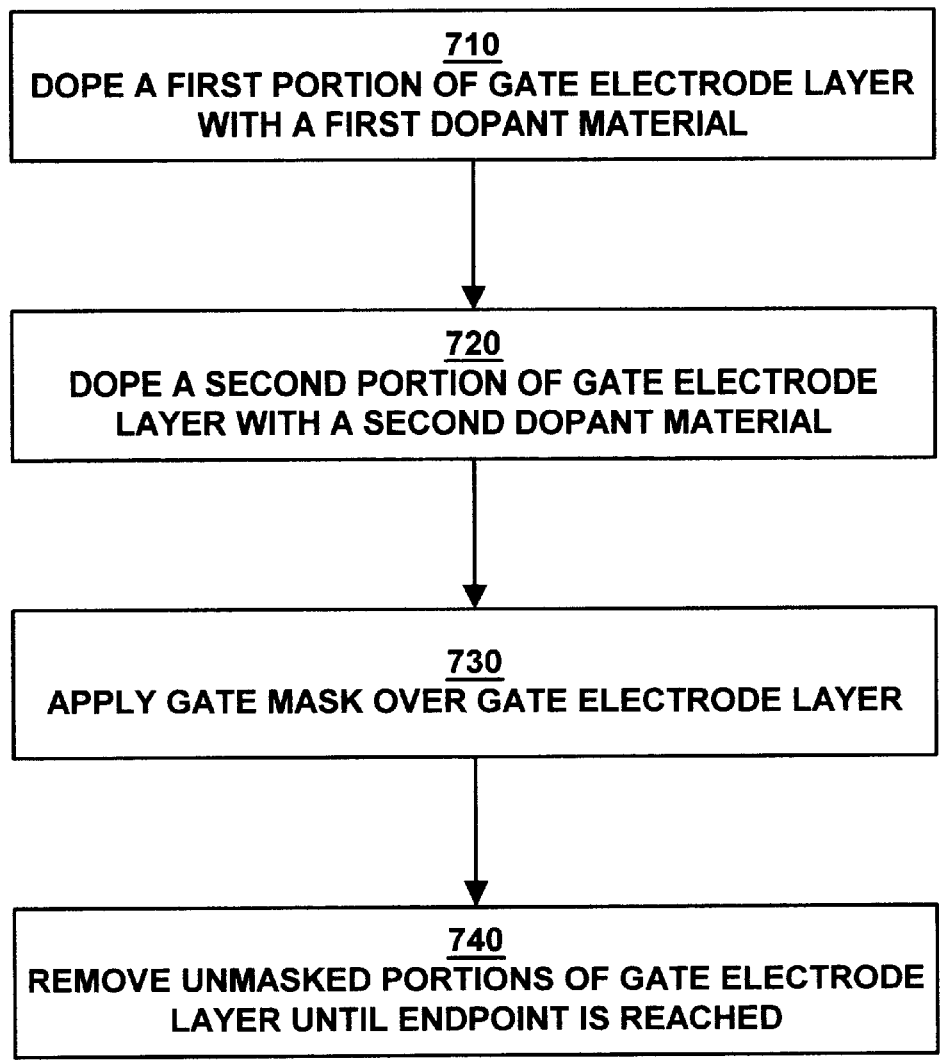
FIG. 7 is a flowchart of the steps in a process for fabricating gates in an integrated circuit in accordance with one embodiment of the present invention.

FIG. 7 is a flowchart of the steps in a process 700 for fabricating gates in an integrated circuit in accordance with one embodiment of the present invention. In the present embodiment, the integrated circuit is fabricated on a laminate comprising a substrate, a gate dielectric layer and a gate electrode layer (e.g., substrate 330, gate dielectric layer 320 and gate electrode layer 310 of FIGS. 3, 4, 5A, 5B, 6A and 6B).

In step 710 of FIG. 7, a first portion of gate electrode layer 310 is doped with a first dopant material. In the present embodiment, the first dopant material is a p-dopant. In one embodiment, the p-dopant is implanted in a location substantially corresponding to the location at which a p-gate is to be formed (e.g., p-doped portion 350 corresponding to p-gate 355 of FIG. 3). In another embodiment, the p-dopant is implanted more precisely; that is, the p-dopant is implanted in p-doped portion 450 (FIG. 4) so that it extends only to the edge of p-gate 355 plus an alignment tolerance 490 (FIG. 4) associated with the alignment of the implant mask. In yet another embodiment, the p-dopant is implanted so that it extends only to the edge of a gate with no allowance for misalignment of the implant mask (e.g., doped portion 540 and gate 550 of FIG. 5A, or p-doped portion 580 and p-gate 575 of FIG. 5B). In still another embodiment, the p-dopant is implanted so that it does not extend to the edge of a gate (e.g., doped portion 640 and gate 650 of FIG. 6A, or p-doped portion 680 and p-gate 675 of FIG. 6B). Thus, in each of these embodiments, the amount of p-dopant is minimized relative to the amount of undoped polysilicon or relative to the amount of n-doped polysilicon.

In step 720 of FIG. 7, a second portion of gate electrode layer 310 is doped with a second dopant material. In the present embodiment, the second dopant material is an n-dopant. In one embodiment, the n-dopant is implanted in those portions of gate electrode layer 310 not implanted with p-dopant (e.g., n-doped portions 365a and 365b of FIG. 3, or n-doped portions 465a and 465b of FIG. 4, or n-doped portions 585a and 585b of FIG. 5B, or n-doped portions 685a and 685b of FIG. 6B). In another embodiment, the n-dopant is more precisely implanted so that it extends only to the edge of a gate (e.g., doped portion 540 of FIG. 5A), or so that it does not extend to the edge of a gate (e.g., doped portion 640 of FIG. 6A).

In step 730 of FIG. 7, a gate mask (e.g., resist 370a and 370b of FIGS. 3, 4, 5B and 6B or resist 370 of FIGS. 5A and 6A) is applied over the those portions of gate electrode layer 310 where gates are to be formed using a gate etch process. In the embodiments of FIGS. 3 and 4, the n-doped portions of gate electrode layer 310 are predominantly exposed to the etchant used in the gate etch process. In the embodiments of FIGS. 5B and 6B, only the n-doped portions of gate electrode layer 310 are exposed to the etchant. In the embodiments of FIGS. 5A and 6A, only the unimplanted portions of gate electrode layer 310 are exposed to the etchant. Thus, in accordance with the present invention, the use of a faster etching material (e.g., the n-doped material or the unimplanted material) is maximized and the use of a slower etching material (e.g., the p-doped material) is minimized in gate electrode layer 310.

In step 740 of FIG. 7, those portions of gate electrode layer 310 that are exposed to the etchant are etched away. The faster etching material (e.g., the n-doped material or the unimplanted material) will etch away faster than the p-doped material, and a strong and detectable endpoint signal will be induced when the etchant reaches gate dielectric layer 320.

The present invention thus provides a method and apparatus thereof that can improve the endpoint signal, so that endpoint is consistently triggered at the correct moment and microtrenching is prevented. The present invention can be used with laminates using various combinations of undoped, n-doped, p-doped, and n/p-doped gate electrode layers (e.g., polysilicon) with different etch rates.

The preferred embodiment of the present invention, optimized gate implants for reducing dopant effects during gate etching, is thus described. While the present invention has been described in particular embodiments, it should be appreciated that the present invention should not be construed as limited by such embodiments, but rather construed according to the following claims.

What is claimed is:

1. A method of fabricating an integrated circuit on a laminate comprising a gate dielectric layer between a gate electrode layer and a substrate, said method comprising the steps of:
   a) doping a first portion of said gate electrode layer with a first dopant material, said first portion substantially corresponding to a location at which a gate of said integrated circuit is to be formed;
   b) doping a second portion of said gate electrode layer with a second dopant material, wherein more of said gate electrode layer is doped with said second dopant material than with said first dopant material and wherein said gate electrode layer doped with said second dopant material is etched away at a faster rate than said gate electrode layer doped with said first dopant material;
   c) applying a gate mask over said gate electrode layer; and
   d) removing unmasked portions of said gate electrode layer using an etchant, said etchant inducing a detectable endpoint signal upon reaching said gate dielectric layer.

2. The method of fabricating an integrated circuit as recited in claim 1 wherein said second portion comprises all portions of said gate electrode layer not doped with said first dopant material.

3. The method of fabricating an integrated circuit as recited in claim 1 wherein said first dopant material is a p-type dopant and said second dopant material is an n-type dopant.

4. The method of fabricating an integrated circuit as recited in claim 1 wherein said substrate is a semiconductor layer comprised of silicon.

5. The method of fabricating an integrated circuit as recited in claim 1 wherein said gate electrode layer is comprised of polysilicon.

6. The method of fabricating an integrated circuit as recited in claim 1 wherein said gate electrode layer is comprised of amorphous silicon.

7. The method of fabricating an integrated circuit as recited in claim 1 wherein said gate dielectric layer is comprised of silicon dioxide.

8. The method of fabricating an integrated circuit as recited in claim 1 wherein said integrated circuit is a deep submicron CMOS (complementary metal-oxide semiconductor).

9. A method of fabricating an integrated circuit on a laminate comprising a gate dielectric layer between a gate electrode layer and a substrate, said method comprising the steps of:
   a) aligning within an alignment tolerance a first implant mask over said gate electrode layer, said first implant mask to allow implantation of a first dopant material into said gate electrode layer at a location at which a first gate of said integrated circuit is to be formed, said first implant mask sized so that said first dopant material does not extend beyond an edge of said first gate plus said alignment tolerance;
   b) implanting said first dopant material into said gate electrode layer such that said first dopant material does not extend beyond said edge of said first gate plus said alignment tolerance;
   c) applying a gate mask over said first dopant material; and
   d) removing said gate electrode layer not under said gate mask using an etchant, said etchant inducing a detectable endpoint signal upon reaching said gate dielectric layer.

10. The method of fabricating an integrated circuit as recited in claim 9 wherein said step b) comprises:
   implanting said first dopant material into said gate electrode layer such that said first dopant material does not extend beyond said edge of said first gate.

11. The method of fabricating an integrated circuit as recited in claim 9 wherein said step b) comprises:
   implanting said first dopant material into said gate electrode layer such that said first dopant material does not extend to said edge of said first gate.

12. The method of fabricating an integrated circuit as recited in claim 11 further comprising the step of, prior to said step c):
   implanting a second dopant material into any portion of said gate electrode layer not implanted with said first dopant material.

13. The method of fabricating an integrated circuit as recited in claim 12 wherein said first dopant material is a p-type dopant and said second dopant material is an n-type dopant.

14. The method of fabricating an integrated circuit as recited in claim 12 wherein said first dopant material is an n-type dopant and said second dopant material is a p-type dopant.

15. The method of fabricating an integrated circuit as recited in claim 9 further comprising the steps of, prior to said step d):

a1) aligning within said alignment tolerance a second implant mask over said gate electrode layer, said second implant mask to allow implantation of a second dopant material into said gate electrode layer at a location at which a second gate of said integrated circuit is to be formed, said second implant mask sized so that said second dopant material does not extend beyond an edge of said second gate plus said alignment tolerance;

b1) implanting said second dopant material into said gate electrode layer such that said second dopant material does not extend beyond said edge of said second gate plus said alignment tolerance; and c1) applying said gate mask over said second dopant material.

16. The method of fabricating an integrated circuit as recited in claim 9 wherein said substrate is a semiconductor layer comprised of silicon.

17. The method of fabricating an integrated circuit as recited in claim 9 wherein said gate electrode layer is comprised of polysilicon.

18. The method of fabricating an integrated circuit as recited in claim 9 wherein said gate electrode layer is comprised of amorphous silicon.

19. The method of fabricating an integrated circuit as recited in claim 9 wherein said gate dielectric layer is comprised of silicon dioxide.

20. The method of fabricating an integrated circuit as recited in claim 9 wherein said integrated circuit is a deep submicron CMOS (complementary metal-oxide semiconductor).

* * * * *